United States Patent
Lin et al.

(10) Patent No.: US 11,598,927 B1
(45) Date of Patent: Mar. 7, 2023

(54) OPTOELECTRONIC DEVICE

(71) Applicant: Advanced Semiconductor Engineering, Inc., Kaohsiung (TW)

(72) Inventors: Jr-Wei Lin, Kaohsiung (TW); Mei-Ju Lu, Kaohsiung (TW); Jung Jui Kang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/472,328

(22) Filed: Sep. 10, 2021

(51) Int. Cl.
*G02B 6/43* (2006.01)
*G02B 6/42* (2006.01)

(52) U.S. Cl.
CPC ............. *G02B 6/43* (2013.01); *G02B 6/4212* (2013.01); *G02B 6/4243* (2013.01)

(58) Field of Classification Search
None
See application file for complete search history.

(56) References Cited

U.S. PATENT DOCUMENTS

| | | | |
|---|---|---|---|
| 9,698,564 B1* | 7/2017 | Shubin | H01S 5/026 |
| 2017/0254954 A1* | 9/2017 | Liu | G02B 6/30 |
| 2019/0179079 A1* | 6/2019 | Potluri | G02B 6/38 |
| 2021/0134751 A1 | 5/2021 | Lu et al. | |
| 2021/0157056 A1* | 5/2021 | Butler | G02B 6/3652 |

OTHER PUBLICATIONS

U.S. Appl. No. 17/129,644, filed Dec. 21, 2020, Lin et al.

* cited by examiner

*Primary Examiner* — Jerry Rahll
(74) *Attorney, Agent, or Firm* — Foley & Lardner LLP

(57) ABSTRACT

An optoelectronic device includes a carrier, an electronic component, a photonic component and a supportive component. The electronic component is electrically coupled to the carrier. The photonic component is electrically coupled to the electronic component. The supportive component is disposed outside the photonic component and the electronic component and configured to support an optical component.

18 Claims, 10 Drawing Sheets

OPTOELECTRONIC DEVICE

1. TECHNICAL FIELD

The present disclosure relates to an optoelectronic device and a method for manufacturing the same.

2. DESCRIPTION OF THE RELATED ART

The demand for network information has increased year by year for implementing cloud services, Internet of Things (IoT), 5G applications, etc. Such applications require high speed data transmission. While being operated at higher and higher speeds and frequencies, traditional cable transmission encounters signal integrity issues due to the high impedance generated by capacitance and inductance of traditional cables. Signal integrity issues cause power loss and limit distance of transmission that can be achieved by traditional cables. In recent years, optical communication is often used in place of traditional cable transmission. In optical communication, optical fibers are used instead of electrically conductive wire between equipment. However, with continuously growing demand for higher speed and frequency, it is necessary to shorten the transmission distance of signal traces within equipment to avoid signal integrity issues at high speed.

One of the difficulties with optical communication products, such as optical transceivers or optical engines, developed with silicon photonics technology is to guide light or an optical signal from a waveguide in a silicon photonics device to an optical component, such as optical fiber. Size matching issues between the silicon photonics device and the optical component may result in energy loss of the light or optical signal. Therefore, the coupling of light or optical signals has become a key development issue, and it is important to improve units per hour (UPH) performance and reduce cost.

SUMMARY

In some embodiments, an optoelectronic device includes a carrier, an electronic component, a photonic component and a supportive component. The electronic component is electrically coupled to the carrier. The photonic component is electrically coupled to the electronic component. The supportive component is disposed outside the photonic component and the electronic component and is configured to support an optical component.

In some embodiments, an optoelectronic device includes a carrier, an electronic component, a photonic component and a supportive component. The electronic component is electrically coupled to the carrier. The photonic component is electrically coupled to the electronic component. The supportive component is electrically coupling the electronic component to the carrier and is configured to support an optical component.

In some embodiments, an optoelectronic device includes a carrier and a passive connecting component on the carrier. The passive connecting component has a first region and a second region. The first region of the passive connecting component electrically connects the photonic component and the carrier. The second region of the passive connecting component is configured to support an optical component.

BRIEF DESCRIPTION OF THE DRAWINGS

Aspects of some embodiments of the present disclosure will be readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
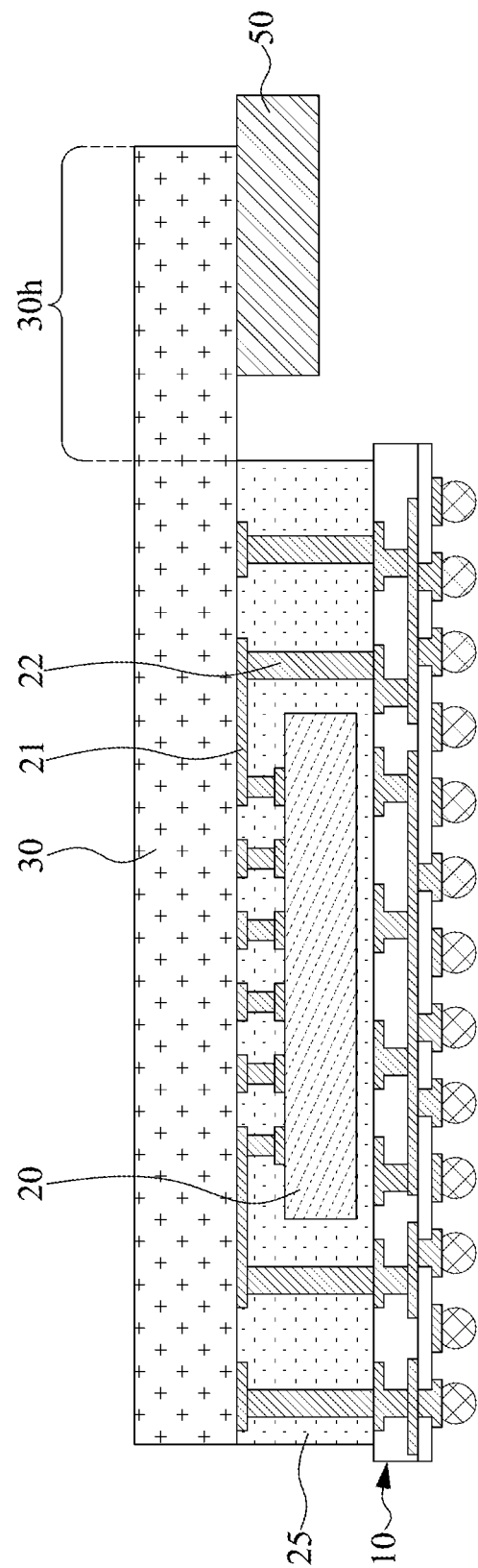
FIG. 1 illustrates a schematic cross-sectional view of an optoelectronic device in accordance with some comparative embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the "active side" or "active surface" of a photonic component may refer to a side or a surface along which a waveguide is disposed, and the waveguide may be disposed adjacent to the active side or the active surface. The "inactive side" or "inactive surface" of a photonic component may refer to a side or a surface along which no waveguide is disposed.

As used herein, the term "active side" or "active surface" of an electronic component may refer to a side or a surface of an electronic component on which contact terminals such as contact pads are disposed, and the "inactive side" or "inactive surface" of an electronic component may refer to a side or a surface of the electronic component on which no contact terminals are disposed.

In some comparative embodiments as illustrated in FIG. 1, an optoelectronic device 1 (e.g., photonic engine) includes a carrier 10, an electronic component 20 (e.g., an electronic die) and a photonic component 30 (e.g., a photonic die). The electronic component 20 is located between the carrier 10 and the electronic component 20 and covered by molding compound 25. The active side of the electronic component 20 faces the active side of the photonic component 30. The electronic component 20 is electrically connected or coupled to a carrier 10 via a circuit layer 21 disposed on the active side of the photonic component 30 and a through molding via (TMV) 22, for power supply or grounding. The photonic component 30 includes an overhang 30h for accommodation of an optical component 50 (e.g., a fiber array unit (FAU)). In the comparative embodiments, only one side of the optical component 50 is fixed to the overhang 30a of the photonic component 30, and the optical component 50 may not be firmly fixed.

An optoelectronic device and a method for manufacturing the same are therefore provided in accordance with some embodiments of the present disclosure. The optoelectronic device includes a supportive or connecting component, such as an interposer, on the carrier. The supportive or connecting component can physically support at least a portion of the optical component such that the optical component can be fixed more firmly as compared to the comparative embodiments as described above. In some embodiments, with the supportive or connecting component supporting the optical component, it is not necessary for the photonic component to have such a long overhang as shown in the comparative embodiments of FIG. 1 for attaching the optical component. As a result, the space of the optoelectronic device can be utilized in a more efficient manner. The optoelectronic device may be made more compact and its overall dimensions may be reduced in accordance with some embodiments of the present disclosure. Moreover, the supportive or connecting component provides better physical or mechanical support for the optical component as compared to the comparative embodiments as described above, thereby increasing the yield of the optoelectronic device. In a further aspect, the supportive or connecting component provides the electrical communication between the carrier and the electronic component and/or the electrical communication between the carrier and the photonic component. As compared to the comparative embodiments as described above, using a discrete supportive or connecting component for electrical communication may increase the flexibility of the design of the optoelectronic device, and reduce the complexity of the manufacturing method of the optoelectronic device.

Figure 2:
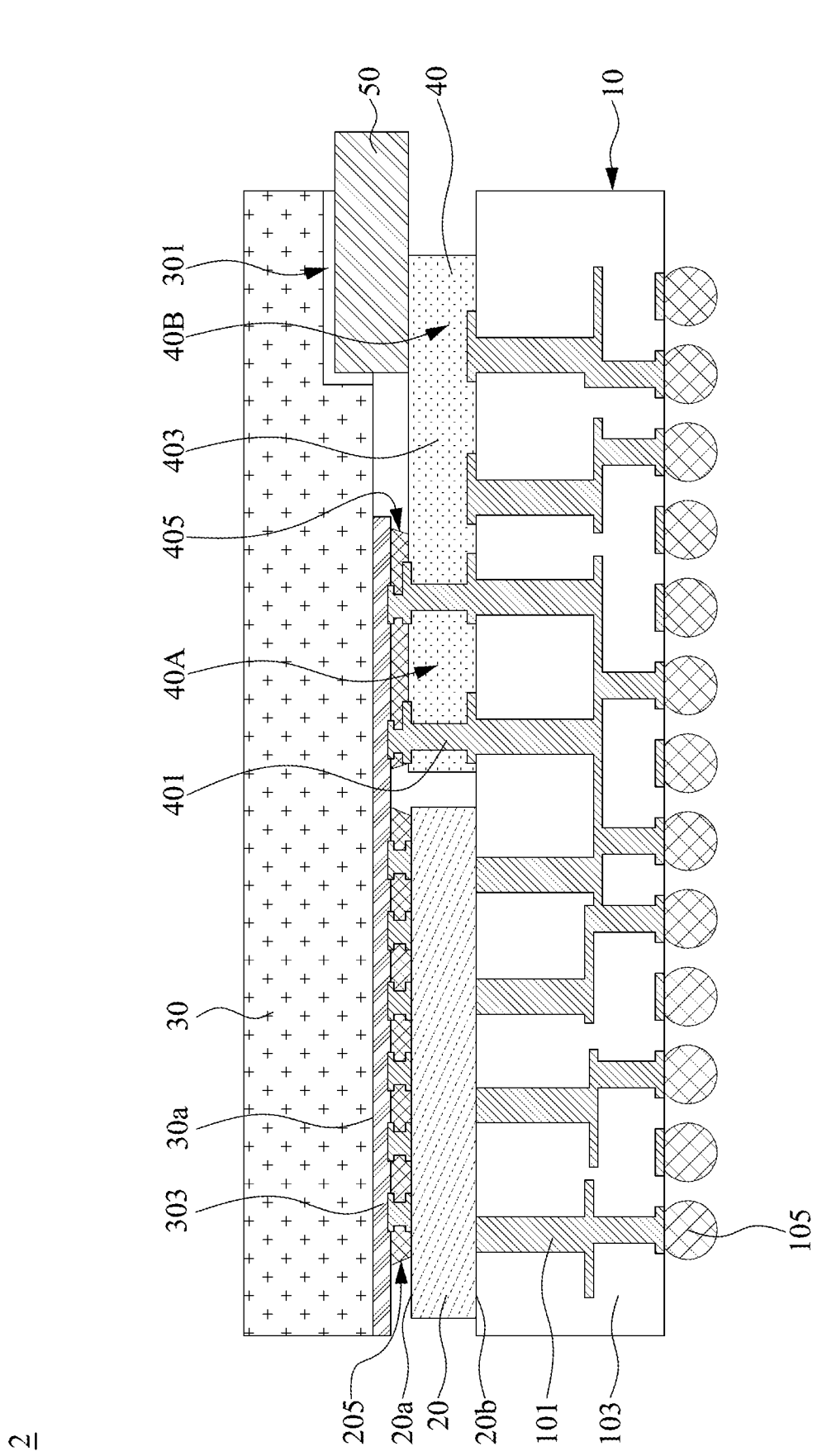
FIG. 2 illustrates a schematic cross-sectional view of an optoelectronic device in accordance with some embodiments of the present disclosure.

FIG. 2 illustrates a schematic cross-sectional view of an optoelectronic device 2 in accordance with some embodiments of the present disclosure. The optoelectronic device 2 includes a carrier 10, an electronic component 20, a photonic component 30, a supportive component 40, and an optical component 50. The supportive component 40 is configured to support an optical component 50. In some embodiments, the supportive component 40 functions as a connecting component for connecting an underlying component and an overlying component. The supportive or connecting component 40 may be referred to as "connecting component 40" or "supportive component 40" for brevity in the present disclosure.

In some embodiments, the carrier 10 includes an electrically conductive structure 101 and a dielectric structure 103. In some embodiments, the carrier 10 may be or include a substrate. The electrically conductive structure 101 may include one or more conductive wiring layers, contact pads disposed at the upper surface and lower surface of the carrier, and vias electrically connecting the conductive wiring layers and pads. In some embodiments, the dielectric structure 103 may include one or more dielectric layers and the one or more dielectric layers and the one or more conductive wiring layers are stacked on one another. The optoelectronic device 2 may further include conductors 105, such as solder balls or bumps, disposed on a lower surface of the carrier 10. The carrier 10 may be configured to build an electrical connection to an external component, such as a printed circuit board (PCB), via the conductors 105. In some embodiments, the carrier 10 may have a thickness of around 400 µm or more.

In some embodiments, the electronic component 20 may be or include an electronic die, and may also be referred to as a first semiconductor die, an electronic semiconductor die or an electronic integrated circuit (EIC) die. In some embodiments, the photonic component 30 may be or include a photonic die, and may also be referred to as a second semiconductor die, a photonic semiconductor die or a photonic integrated circuit (PIC) die. In some embodiment, unlike the electronic component 20 and the photonic component 30 which are known as active components, the supportive or connecting component 40 is a passive component, and may be referred to as a passive supportive component or a passive connecting component in the present disclosure. In some embodiments, the supportive or connecting component 40 may be or include an interposer, such as a silicon (Si) interposer, and may also be referred to as an interposer or a passive interposer. In some embodiments, the supportive or connecting component 40 does not include an active electronic element, such as a transistor, diode, or the like. In some embodiments, the electronic component 20 is an active component while the supportive or connecting component 40 is a passive component.

In some embodiments, the optical component 50 includes one or more optical fibers. In some embodiments, the optical component 50 may be or include a fiber array unit (FAU). In some embodiments, the optical component 50 may include an optical fiber having a thickness of around 125 µm. In some embodiments, the optical component 50 may include an optical fiber (or fiber array unit) surrounded by a housing and thus may have a thickness of greater than 125 µm.

Referring to FIG. 2, in some embodiments, the electronic component 20 is disposed on the carrier 10. In some embodiments, the photonic component 30 is disposed on the electronic component 20. In some embodiments, the electronic component 20 is disposed between the carrier 10 and the photonic component 30. In some embodiments, the supportive or connecting component 40 is disposed on the carrier 10. In some embodiments, the supportive or connecting component 40 is disposed adjacent to or next to the electronic component 20. In some embodiments, the supportive or connecting component 40 and the electronic component 20 are disposed at a substantially same horizontal level. In some embodiments, the supportive or connecting component 40 is disposed between the carrier 10 and the photonic component 30. In some embodiments, the photonic component 30 is disposed on the supportive or connecting component 40. In some embodiments, the optical component 50 is disposed on the supportive or connecting component 40. In some embodiments, the optical component 50 is disposed between the carrier 10 and the photonic component 30. In some embodiments, the optical component 50 is disposed between the photonic component 30 and the supportive or connecting component 40.

In some embodiments, the electronic component 20 has an active surface 20a and a surface 20b (e.g., an inactive surface) opposite to the active surface 20a. The active surface 20a faces the photonic component 30 (i.e., the active surface 30a of the photonic component 30). The surface 20b of the electronic component 20 faces the carrier 10. In some embodiments, the electronic component 20 is electrically connected or coupled to the carrier 10. In some embodiments, the electronic component 20 is electrically connected or coupled to the carrier 10 through the active surface 20*a* and/or the supportive or connecting component 40. In some embodiments, the electronic component 20 is electrically connected or coupled to the carrier 10 through the surface 20*b* and, for example, a through conductive via (not shown) in the electronic component 20. In some embodiments, the electronic component 20 receives power from the carrier 10 and then provides a driving signal to the photonic component 30. In some embodiments, the electronic component 20 is configured to amplify signals received from the photonic component 30. In some embodiments, the electronic component 20 may include a modulator driver (DRV), a transimpedance amplifier (TIA), or a combination thereof. In some embodiments, the electronic component 20 is thinned and may have a thickness of around 75 μm to around 100 μm.

In some embodiments, the photonic component 30 has an active surface 30*a* facing the carrier 10. In some embodiments, the active surface 30*a* faces the electronic component 20 and the supportive or connecting component 40 disposed between the photonic component 30 and the carrier 10. In some embodiments, the active surface 30*a* of the photonic component 30 faces the active surface 20*a* of the electronic component 20. In some embodiments, the photonic component 30 includes a trench 301 at the active surface 30*a*. In some embodiments, the trench 301 may be or include a V-groove, a U-groove, or the like. In some embodiments, the trench 301 faces the supportive or connecting component 40. The trench 301 is located above the supportive or connecting component 40 and defines a space together with the connecting component 40 for accommodation of the optical component 50.

In some embodiments, the photonic component 30 includes a redistribution layer (RDL) 303 on the active surface 30*a*. In some embodiments, the RDL 303 include a dielectric layer and a conductive layer (including a conductive trace and a conductive via) embedded in the dielectric layer. In some embodiments, the RDL 303 may be, but is not limited to, a multi-layered RDL including conductive layers and dielectric layers stacked alternately. In some embodiments, the RDL 303 is disposed between the photonic component 30 and the electronic component 20 and/or between the photonic component 30 and the supportive or connecting component 40. In some embodiments, the RDL 303 extends over the electronic component 20 and the supportive or connecting component 40. In some embodiments, the RDL 303 extends beyond an edge of the electronic component 20. In some embodiments, the RDL 303 extends beyond an edge of the supportive or connecting component 40. In some embodiments, the RDL 303 forms a bridge between the electronic component 20 and the supportive or connecting component 40. In some embodiments, the RDL 303 is spaced apart from the trench 301 of the photonic component 30, and the RDL 303 does not overlap the trench 301 of the photonic component 30. In some embodiments, the RDL 303 electrically connects or couples the electronic component 20 and the supportive or connecting component 40. In some embodiments, the RDL 303 is electrically connected or coupled to the photonic component 30. In some embodiments, the RDL 303 electrically connects or couples the photonic component 30 to the electronic component 20. In some embodiments, the RDL 303 electrically connects or couples the photonic component 30 to the supportive or connecting component 40. In some embodiments, the RDL 303 electrically connects or couples the electronic component 20 to the supportive or connecting component 40. In some embodiments, the RDL 303 is electrically connected or coupled to the carrier 10 through the supportive or connecting component 40. In some embodiments, the RDL 303 electrically connects or couples the electronic component 20 to the carrier 10. In some embodiments, the RDL 303 electrically connects or couples the photonic component 30 to the carrier 10. In some embodiments, the photonic component 30 is electrically connected or coupled to the carrier 10 through the RDL 303 and the supportive or connecting component 40. In some embodiments, the electronic component 20 is electrically connected or coupled to the carrier 10 through the conductive structure 205 (discussed below), the RDL 303 and the supportive or connecting component 40. In some embodiments, the photonic component 30 may have a thickness of around 200 μm to 250 μm.

In some embodiments, the supportive or connecting component 40 includes a first region 40A and a second region 40B. The first region 40A of the supportive or connecting component 40 is configured to communicate electrical signals. The first region 40A of the supportive or connecting component 40 may include conductive through via(s) 401 for electrical communication. In some embodiments, the conductive through via 401 is electrically connected or coupled to the carrier 10. In some embodiments, the conductive through via 401 is electrically connected or coupled to the RDL 303. In some embodiments, the conductive through via 401 is electrically connected or coupled to the electronic component 20 or the photonic component 30 via the RDL 303, and therefore, the supportive or connecting component 40 may function as a bridge which electrically connects or couples the electronic component 20 or the photonic component 30 to the carrier 10. The second region 40B of the supportive or connecting component 40 is configured to support the optical component 50. The supportive or connecting component 40 can physically support at least a portion of the optical component 50. As a result, the optical component 50 can be attached more firmly as compared to the comparative embodiments of FIG. 1. In some embodiments, at least two sides (e.g., the upper surface and the lower surface) of the optical component 50 can be supported or fixed by the photonic component 30 and the supportive or connecting component 40, respectively.

As compared to some embodiments where a through conductive via(s) is formed in the electronic component 20, the embodiments as illustrated in FIG. 2 where the conductive through via(s) 401 is disposed in the first region 40A of the supportive or connecting component 40 allows the electronic component 20 to have greater design flexibility. Since it is unnecessary to arrange through molding vias around the electronic component 20 for power supply or grounding, it becomes possible to arrange more active and/or passive electronic elements around or within the electronic component 20. As a result, the optoelectronic device may have more or better functionalities. Moreover, disposition of the conductive through via(s) 401 in the first region 40A of the connecting component 20 may prevent or mitigate damage to the electronic component 20 during formation of the through conductive via(s) in the electronic component 20, thereby increasing the yield of the optoelectronic device.

In some embodiments, the supportive or connecting component 40 has a thickness similar to a thickness of the electronic component 20. In some embodiments, the supportive or connecting component 40 may have a thickness of around 75 μm to around 100 μm. In some embodiments, a thickness of more than 100 μm may cause difficulty in forming the conductive through via 401 penetrating the supportive or connecting component 40.

The supportive or connecting component 40 is a passive component, which does not include any active device and does not require an external power source to function. In some embodiments, the supportive or connecting component 40 includes a non-conductive base substrate 403 and a through conductive via 401 penetrating the non-conductive base substrate 403. In some embodiments, the non-conductive base substrate 403 includes a semiconductive material, such as silicon. In some embodiments, the non-conductive base substrate 403 includes a dielectric material, such as epoxy resin, polyimide, glass, or the like. In some embodiments, the non-conductive base substrate 403 of the supportive or connecting component 40 is spaced apart from the electronic component 20. In some other embodiments where the non-conductive base substrate 403 and the electronic component 20 are disposed adjacent to each other, the non-conductive base substrate 403 of the supportive or connecting component 40 has an interface with the electronic component 20.

In some embodiments, the optical component 50 is disposed in a space defined by the photonic component 30 and the supportive or connecting component 40. In some embodiments, the space is defined by the trench 301 and a surface (e.g., an upper surface) of the supportive or connecting component 40 facing the photonic component 30. In some embodiments, the optical component 50 is optically coupled to the photonic component 30. In some examples, the optical component 50 is optically coupled to the photonic component 30 by a passive alignment approach using, for example, the trench 301, such as a V-groove, a U-groove, or the like, as illustrated in FIG. 2. In some embodiments, an adhesive is applied between the optical component 50 and the trench 301 of the photonic component 30 to enhance the adhesion between the optical component 50 and the photonic component 30. In some embodiments, an adhesive is applied between the optical component 50 and the supportive or connecting component 40 to enhance the adhesion between the optical component 50 and the supportive or connecting component 40. In some embodiments, at least a portion of a lower surface of the optical component 50 is in contact, such as in physical contact, with the upper surface of the supportive or connecting component 40.

Still referring to FIG. 2, in some embodiments, the optoelectronic device 2 includes a conductive structure 205 between the electronic component 20 and the photonic component 30. In some embodiments, the optoelectronic device 2 includes a conductive structure 405 between the photonic component 30 and the supportive or connecting component 40. In some embodiments, the conductive structure 205 and the conductive structure 405, respectively, include conductive pillars, conductive pads, conductive bumps, and/or an under-fill material (including a dielectric material, such as epoxy or the like) covering the conductive pillars, conductive pads and/or conductive bumps. In some embodiments, the conductive structure 205 is electrically connected or coupled to the active surface 20a of the electronic component 20. In some embodiments, the conductive structure 405 is disposed on the first region 40A of the supportive or connecting component 40 and electrically connected or coupled to the conductive through via 401. In some embodiments, the conductive structure 205 and the conductive structure 405, respectively, are electrically connected or coupled to the RDL 303. In some embodiments, the conductive structure 205 electrically connects or couples the photonic component 30 to the electronic component 20. In some embodiments, the conductive structure 405 electrically connects or couples the photonic component 30 to the supportive or connecting component 40.

Figure 3:
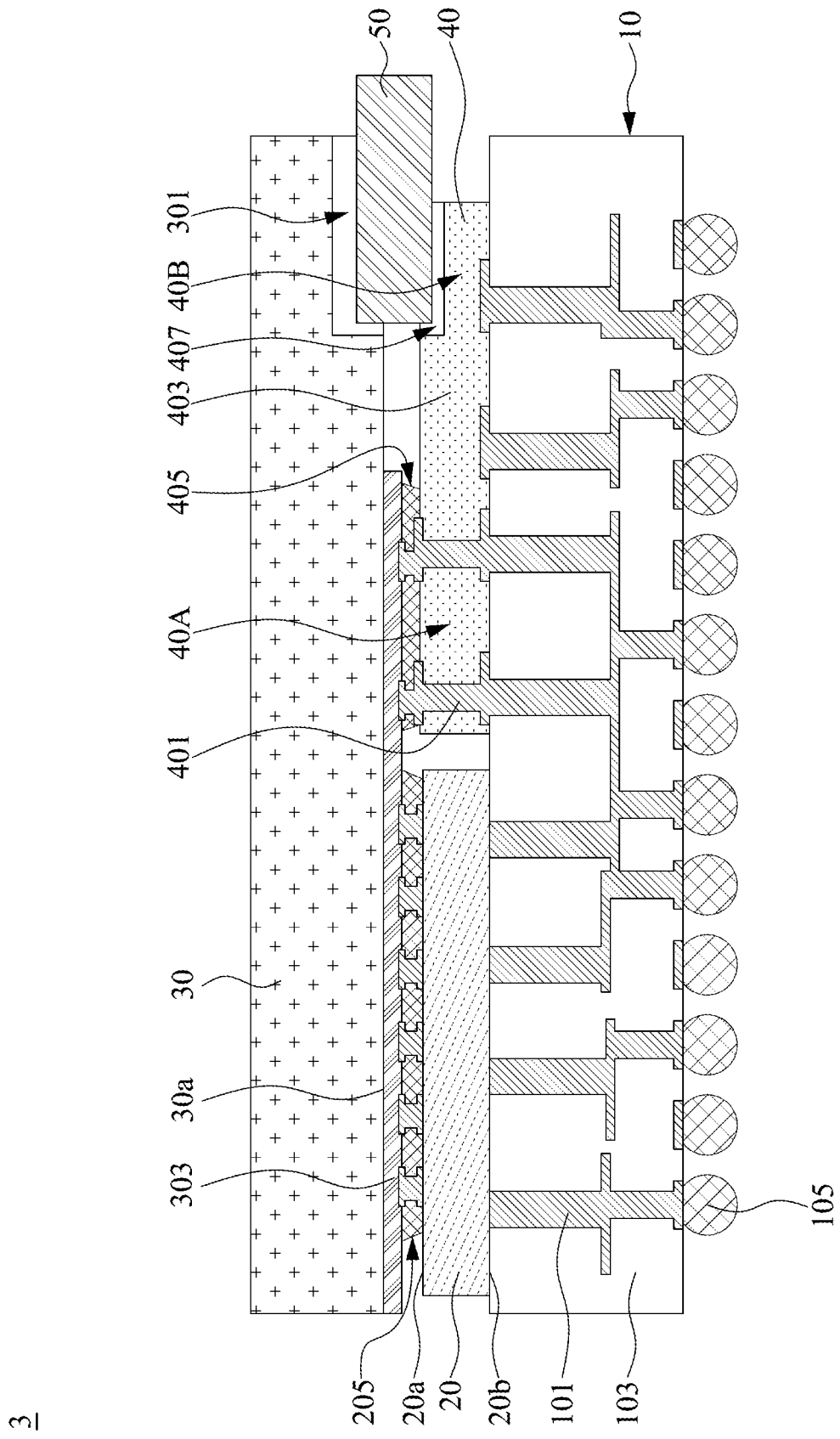
FIG. 3 illustrates a schematic cross-sectional view of an optoelectronic device in accordance with some embodiments of the present disclosure.

FIG. 3 illustrates a schematic cross-sectional view of an optoelectronic device 3 in accordance with some embodiments of the present disclosure. The optoelectronic device 3 is similar to the optoelectronic device 2 as described and illustrated with reference to FIG. 2, except that the supportive or connecting component 40 includes a trench 407 for accommodation of at least a portion of the optical component 50. The trench 407 is located in the second region 40B of the supportive or connecting component 40. The trench 407 is located at a surface (e.g., an upper surface) of the supportive or connecting component 40 facing the photonic component 30. In some embodiments, the trench 407 of the supportive or connecting component 40 faces the trench 301 of the photonic component 30. In some embodiments, the trench 407 of the supportive or connecting component 40 and the trench 301 of the photonic component 30 collectively define a space for accommodating a portion of the optical component 50. The trench 407 may be or include a V-groove, a U-groove, or the like. The trench 407 may provide physical support for the optical component 50. In some embodiments, the trench 407 is in contact with at least a portion of an outer surface of the optical component 50. In some embodiments, the trench 407 supports at least a portion (such as a point, line or surface) of the optical component 50. In some examples where the optical component 50 has a round shape and the trench 407 is a U-groove, the trench 407 wraps at least a portion of the outer surface of the optical component 50. Therefore, in the embodiments according to the present disclosure, the optical component 50 has more outer surface areas supported or fixed by the photonic component 30 and the supportive or connecting component 40 as compared to the comparative embodiments of FIG. 1, so the optical component 50 can be attached more firmly. In some embodiments, an adhesive is applied between the optical component 50 and the trench 407 of the supportive or connecting component 40, so that the optical component 50 can be fixed or attached even more firmly.

With the trench 301 of the photonic component 30 and the trench 407 of the connecting component 40, the optical component 50 can be integrated into the optoelectronic device 3 without taking much additional space. As a result, the optoelectronic device 3 may be made more compact, and miniaturization of the optoelectronic device can be facilitated. Moreover, a depth of the trench 407 may be adjusted to allow for a better passive alignment of the optical component 50 with the photonic component 30, thereby enhancing optical coupling efficiency.

Figure 4:
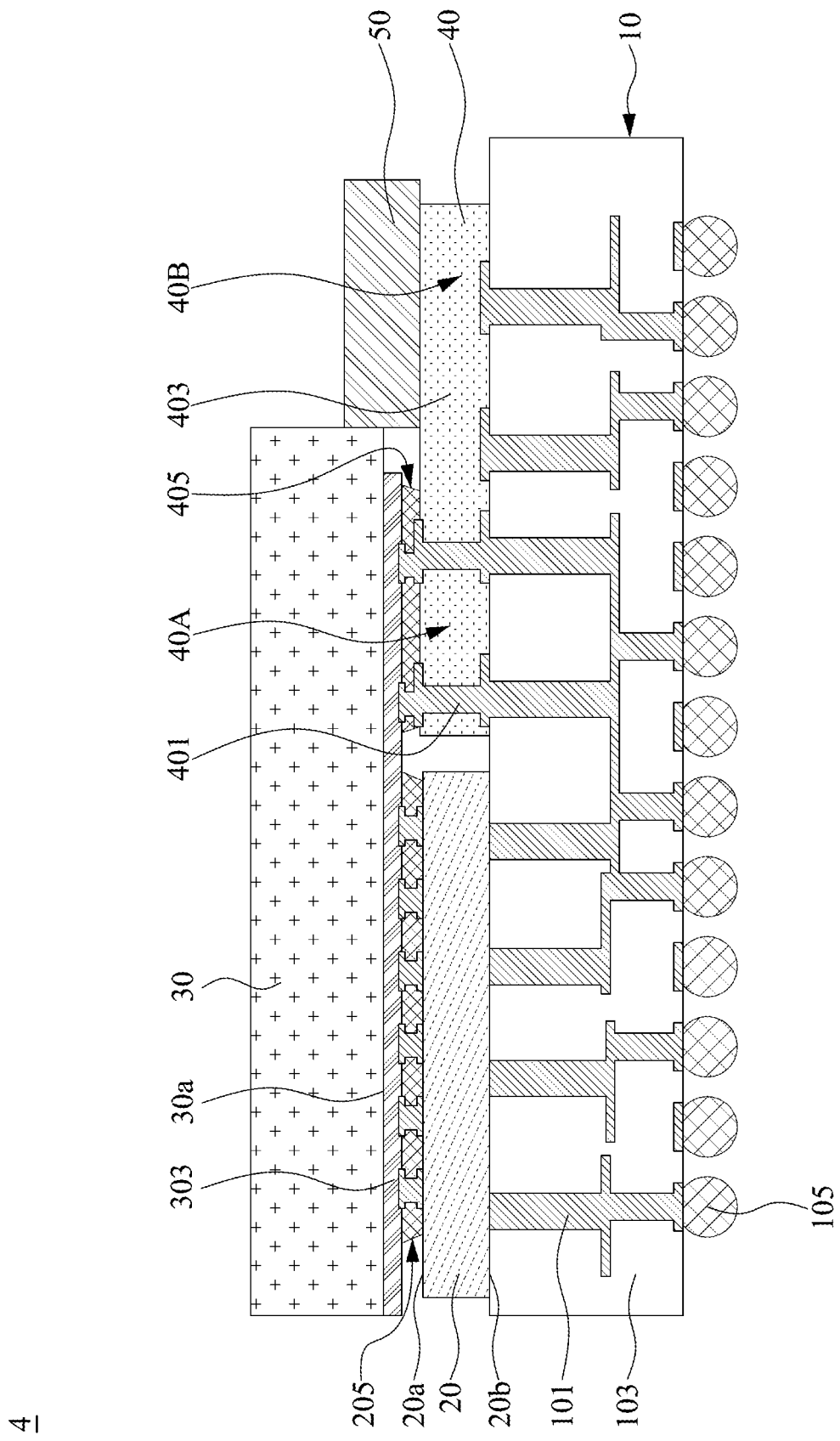
FIG. 4 illustrates a schematic cross-sectional view of an optoelectronic device in accordance with some embodiments of the present disclosure.

FIG. 4 illustrates a schematic cross-sectional view of an optoelectronic device 4 in accordance with some embodiments of the present disclosure. The optoelectronic device 4 is similar to the optoelectronic device 2 as described and illustrated with reference to FIG. 2, except that the optical component 50 is disposed on a lateral surface of the photonic component 30. The lateral surface of the photonic component 30 and a surface (e.g., an upper surface) of the connecting component 40 define a space for accommodation of the optical component 50. The connecting component 40 can physically support the optical component 50 and two sides (e.g., the lateral surface and the lower surface) of the optical component 50 can be supported or fixed by the photonic component 30 and the connecting component 40, respectively. As a result, the optical component 50 can be attached more firmly as compared to the comparative embodiments of FIG. 1. In some embodiments, the optical component 50 may be optically coupled to the photonic component 30 by an active alignment approach, such as an edge coupling approach. In some other embodiments where the connecting component 40 includes a trench as discussed above with respect to FIG. 3, the optical component 50 may be optically coupled to the photonic component 30 by a passive alignment approach.

FIG. 5A, FIG. 5B, FIG. 5C, FIG. 5D, FIG. 5E and FIG. 5F illustrate various stages of a method for manufacturing an optoelectronic device in accordance with some embodiments of the present disclosure.

Figure 5A:
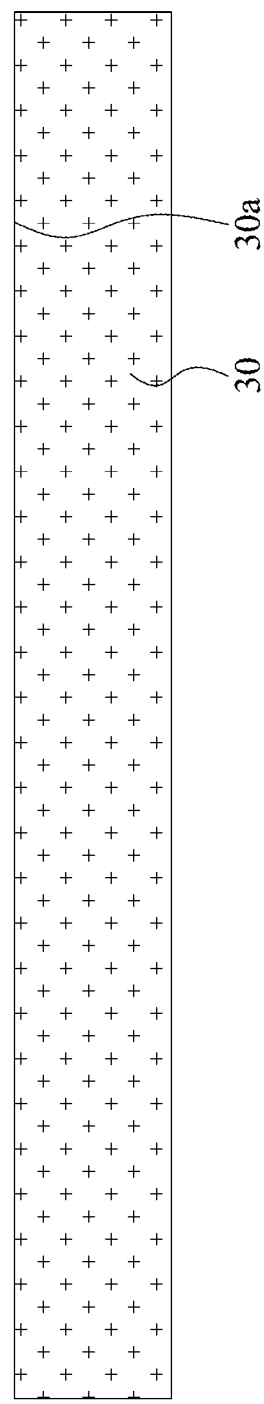
FIG. 5A, FIG. 5B, FIG. 5C, FIG. 5D, FIG. 5E and FIG. 5F illustrate various stages of a method for manufacturing an optoelectronic device in accordance with some embodiments of the present disclosure.

As illustrated in FIG. 5A, a photonic component 30 is provided. The photonic component 30 has an active surface 30a.

Figure 5B:
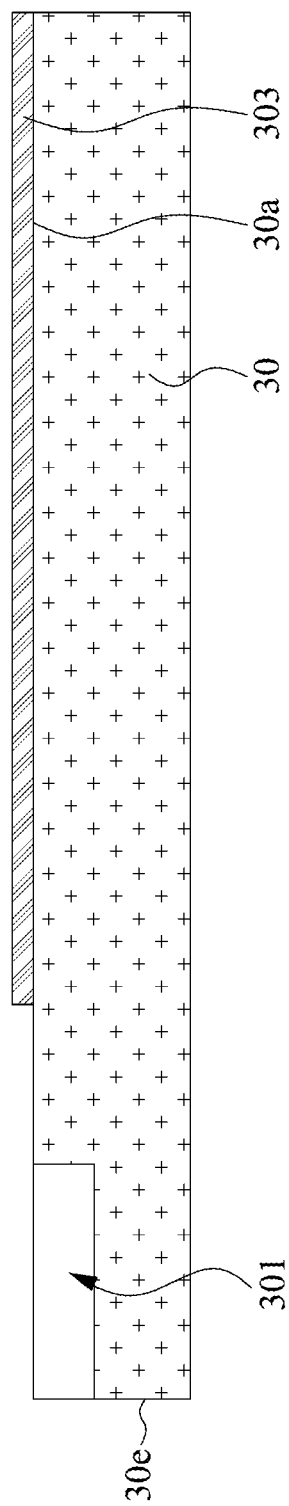

As illustrated in FIG. 5B, a trench 301 is formed by recessing from the active surface 30a and is adjacent to an edge (also referred to as a lateral surface) 30e of the photonic component 30, and an RDL 303 is formed on the active surface 30a of the photonic component 30.

Figure 5C:
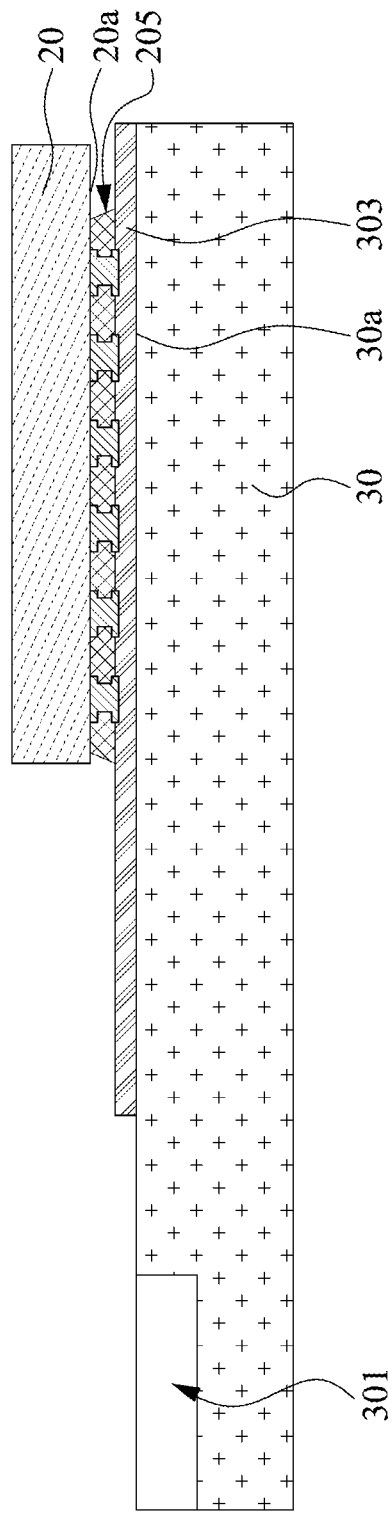

As illustrated in FIG. 5C, an electronic component 20 is flipped so that an active surface 20a of the electronic component 20 faces the active surface 30a of the photonic component 30, and the electronic component 20 is disposed on, attached to, and electrically connected to the RDL 303 of the photonic component 30. A conductive structure 205 is formed between the electronic component 20 and the photonic component 30 or the RDL 303. A portion of the RDL 303 is exposed from the electronic component 20.

Figure 5D:
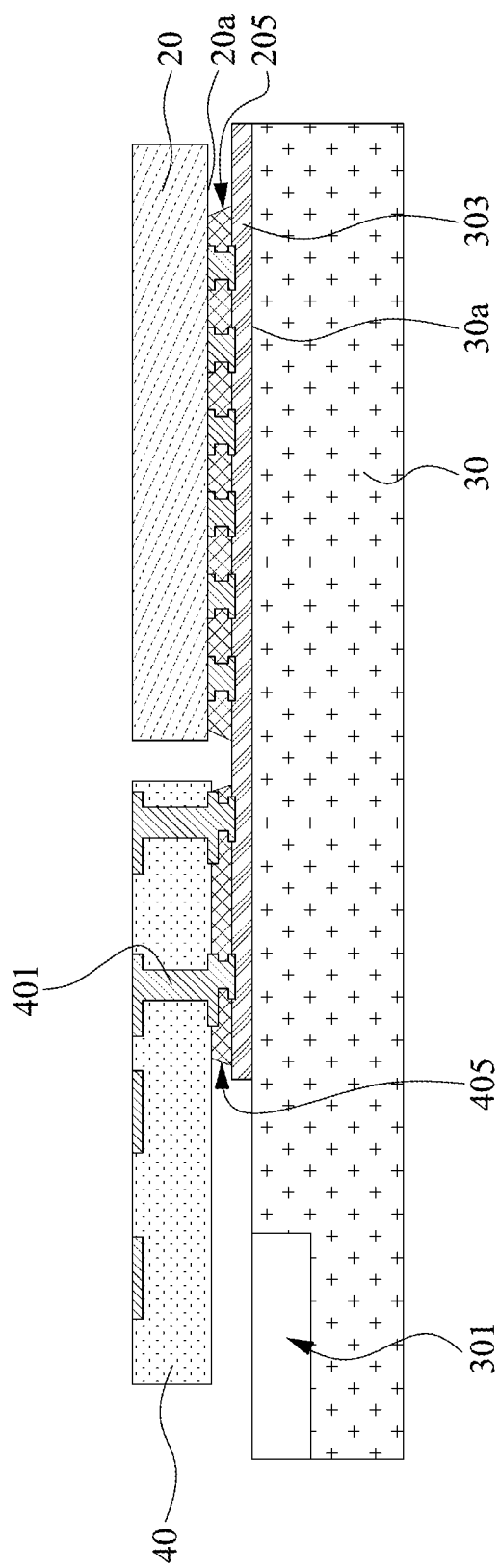

As illustrated in FIG. 5D, a connecting component 40 is disposed on the active surface 30a of the photonic component 30. The connecting component 40 including a conductive through via 401 is disposed on the RDL 303 and electrically connected or coupled to the photonic component 30. The conductive through via 401 is electrically connected or coupled to the portion of the RDL 303 exposed from the electronic component 20. A conductive structure 405 is formed between the connecting component 40 and the photonic component 30 or the RDL 303.

Figure 5E:
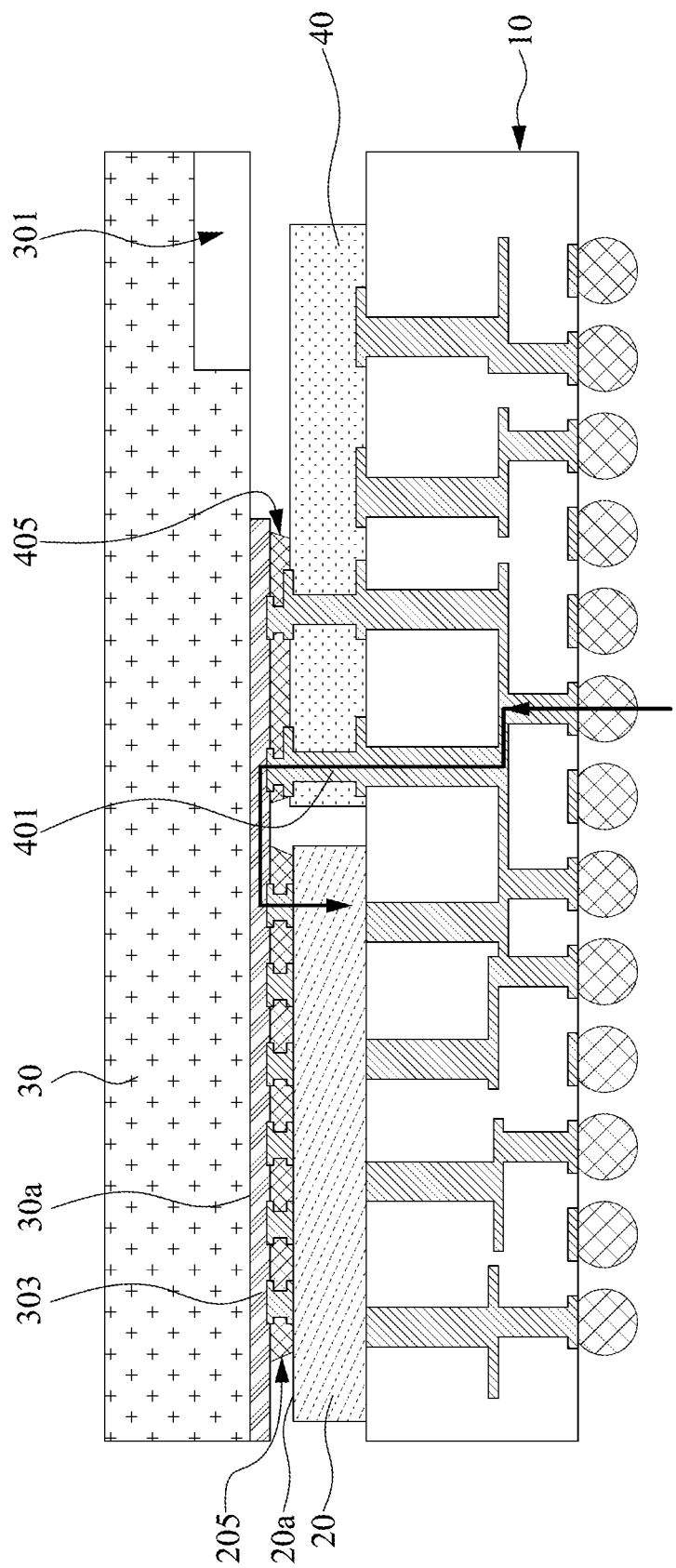

As illustrated in FIG. 5E, an assembly of the photonic component 30, the electronic component 20 and the connecting component 40 is flipped and attached to a carrier 10. The connecting component 40 is electrically connected or coupled to the carrier 10, such that an electrical connection path is formed among the electronic component 20, the conductive structure 205, the RDL 303, the conductive structure 405, the connecting component 40 and the carrier 10.

Figure 5F:
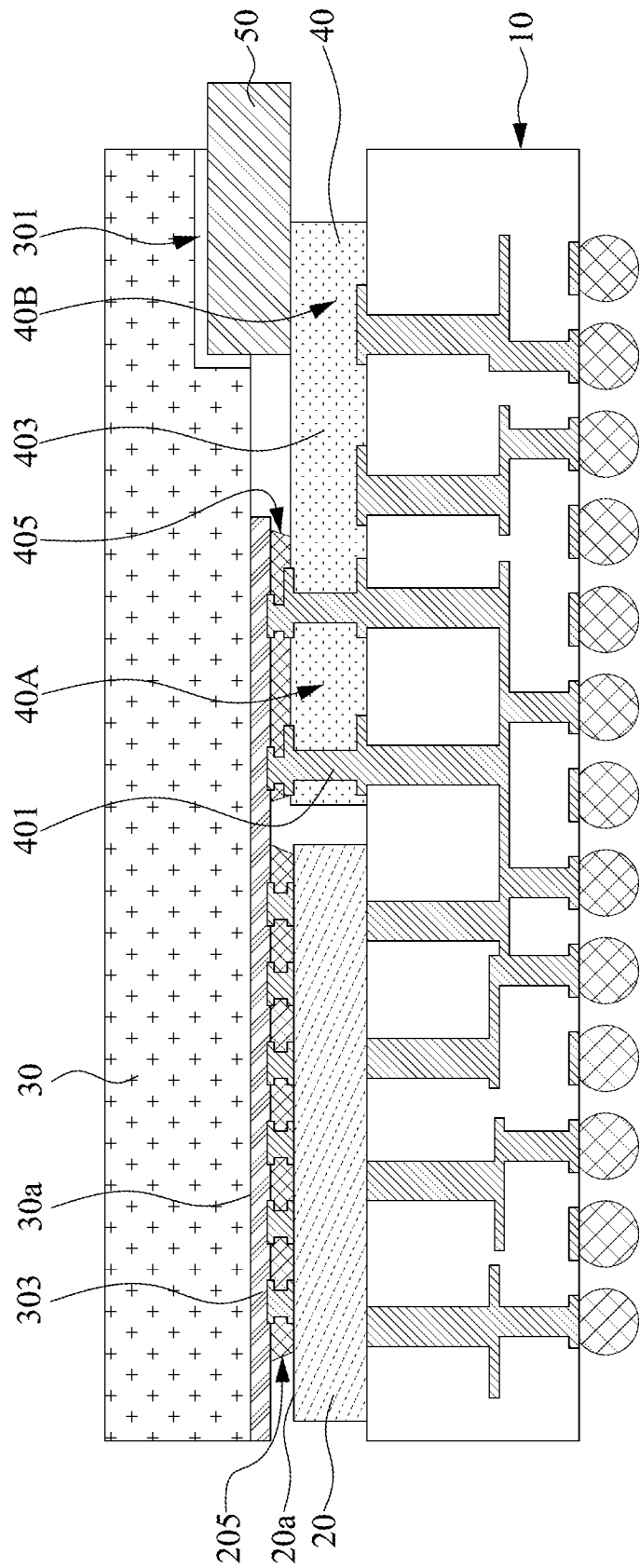

As illustrated in FIG. 5F, an optical component 50 is optically coupled to the photonic component 30 by edge coupling. The optical component 50 may be aligned with a waveguide of the photonic component 30 by a passive alignment approach using the trench 301. The optical component 50 is disposed on a surface of the connecting component 40 facing the photonic component 30. A portion of the optical component 50 is accommodated in the trench 301 of the photonic component 30.

The present disclosure provides optoelectronic devices and methods for manufacturing the same. The optoelectronic devices include a supportive or connecting component, such as an interposer, on a carrier. The supportive or connecting component can not only electrically connect an electronic component to the carrier, but can also provide physical or mechanical support for an optical component to be optically coupled to a photonic component. Therefore, the optical component can be integrated into the optoelectronic devices with better stability, and the yield of the optoelectronic device can be increased.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of the embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially parallel" can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially perpendicular" can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. In addition, a first surface of an object is "substantially level" with a second surface of another object if the first surface and the second surface are at the same plane within a variation of ±10%, such as ±5%, ±4%, ±3%, ±2%, ±1%, ±0.5%, ±0.1% or ±0.05%, of a height/length of the object.

Two surfaces can be deemed to be "coplanar" or "substantially coplanar" if a displacement between the two surfaces is no greater than 5 μm, no greater than 2 μm, no greater than 1 μm, or no greater than 0.5 μm. A surface can be deemed to be substantially flat if a displacement between the highest point and the lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

While the present disclosure has been described and illustrated with reference to specific embodiments thereof, these descriptions and illustrations are not limiting. It should be understood by those skilled in the art that various changes may be made, and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optoelectronic device, comprising:
    a carrier;
    an electronic component electrically coupled to the carrier;
    a photonic component electrically coupled to the electronic component; and
    a supportive component disposed outside the photonic component and the electronic component and configured to support an optical component;
    wherein the electronic component has an active surface facing the photonic component and the electronic component is electrically connected to the carrier through the supportive component.

2. The optoelectronic device of claim 1, wherein the electronic component is disposed between the carrier and the photonic component.

3. The optoelectronic device of claim 1, further comprising the optical component disposed between the supportive component and the photonic component.

4. The optoelectronic device of claim 3, wherein the photonic component comprises a trench configured to accommodate a portion of the optical component.

5. The optoelectronic device of claim 1, wherein the supportive component comprises a trench configured to accommodate a portion of the optical component.

6. The optoelectronic device of claim 1, wherein the optical component is disposed in a space defined by the supportive component and the photonic component.

7. The optoelectronic device of claim 1, wherein the photonic component has an active surface facing the supportive component, and the photonic component comprises a trench at the active surface for accommodation of a portion of the optical component.

8. The optoelectronic device of claim 1, wherein the supportive component comprises a first trench and the photonic component comprises a second trench, and the first trench faces the second trench, and wherein the first trench and the second trench collectively accommodate a portion of the optical component.

9. An optoelectronic device, comprising:
    a carrier;
    an electronic component electrically coupled to the carrier;
    a photonic component electrically coupled to the electronic component; and
    a supportive component electrically coupling the electronic component to the carrier and configured to support an optical component.

10. The optoelectronic device of claim 9, further comprising a redistribution layer electrically connecting the electronic component with the photonic component.

11. The optoelectronic device of claim 9, further comprising a redistribution layer electrically connecting the electronic component with the carrier.

12. The optoelectronic device of claim 9, further comprising the optical component, wherein the optical component is optically coupled to the photonic component.

13. The optoelectronic device of claim 12, wherein the optical component is optically coupled to a waveguide of the photonic component.

14. The optoelectronic device of claim 10, wherein the redistribution layer electrically couples the photonic component and the carrier.

15. The optoelectronic device of claim 9, further comprising a redistribution layer on an active surface of the photonic component, wherein the supportive component electrically connects the redistribution layer with the carrier.

16. The optoelectronic device of claim 15, wherein the redistribution layer is spaced apart from a trench of the photonic component.

17. An optoelectronic device, comprising:
    a carrier;
    a passive connecting component on the carrier, the passive connecting component having a first region and a second region, wherein the first region of the passive connecting component electrically connects a photonic component and the carrier, and the second region of the passive connecting component is configured to support an optical component; and
    an electronic component disposed on the carrier and having an active surface facing the photonic component, wherein the electronic component is electrically connected to the carrier through a conductive through via of the passive connecting component.

18. The optoelectronic device of claim 17, wherein the second region of the passive connecting component comprises a trench, and the trench is configured to accommodate a portion of the optical component.

* * * * *